(12) United States Patent
Belopolsky et al.

(10) Patent No.: US 6,224,417 B1
(45) Date of Patent: May 1, 2001

(54) ASSEMBLY CONTAINING A MODULAR JACK AND A LIGHT EMITTING DIODE

(75) Inventors: Yakov Belopolsky, Harrisburg; Lee W. Potteiger, Lewisberry, both of PA (US)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/127,148

(22) Filed: Jul. 31, 1998

Related U.S. Application Data

(63) Continuation-in-part of application No. 08/808,514, filed on Feb. 27, 1997, now Pat. No. 5,915,993.

(51) Int. Cl.[7] .................................................. H01R 3/00
(52) U.S. Cl. ............................................................ 439/490
(58) Field of Search .................................. 439/55, 56, 79, 439/488–490, 607, 620

(56) References Cited

U.S. PATENT DOCUMENTS

| | | |
|---|---|---|
| 3,808,581 | 4/1974 | Murray . |
| 4,545,632 | 10/1985 | Maier et al. . |
| 4,768,961 | 9/1988 | Lau ........................................ 439/61 |
| 4,924,213 | 5/1990 | Decho et al. ........................ 340/653 |
| 4,978,317 | 12/1990 | Pocrass ................................ 439/490 |
| 5,222,164 | 6/1993 | Bass et al. ............................. 385/14 |
| 5,601,451 | 2/1997 | Driones et al. ...................... 439/490 |
| 5,613,873 | 3/1997 | Bell, Jr. ................................ 439/490 |
| 5,685,737 | 11/1997 | Morin et al. ......................... 439/490 |
| 5,876,239 * | 3/1999 | Morin et al. ......................... 439/490 |
| 5,885,100 | 3/1999 | Talend et al. . |
| 5,915,993 * | 6/1999 | Belopolsky et al. ................. 439/490 |

* cited by examiner

*Primary Examiner*—Khiem Nguyen
(74) *Attorney, Agent, or Firm*—Brian J. Hamilla; M. Richard Page

(57) ABSTRACT

An assembly which includes a jack having an insulative housing with first and second longitudinal walls positioned such that said second longitudinal wall is positioned over said first longitudinal wall in spaced parallel relation. At least one lateral wall is interposed between said first and second longitudinal wall. The jack is positioned such that the PCB is interposed between said first and second longitudinal wall. The first planar surface of the PCB faces the first longitudinal wall to form a first section of the jack, and the second planar surface of the PCB faces the second longitudinal wall to form a second section of the jack. Conductive terminals extend from the jack in said second section. An LED is located in the first section of the jack so that it does not interfere with signals passing through the conductive terminals.

22 Claims, 11 Drawing Sheets

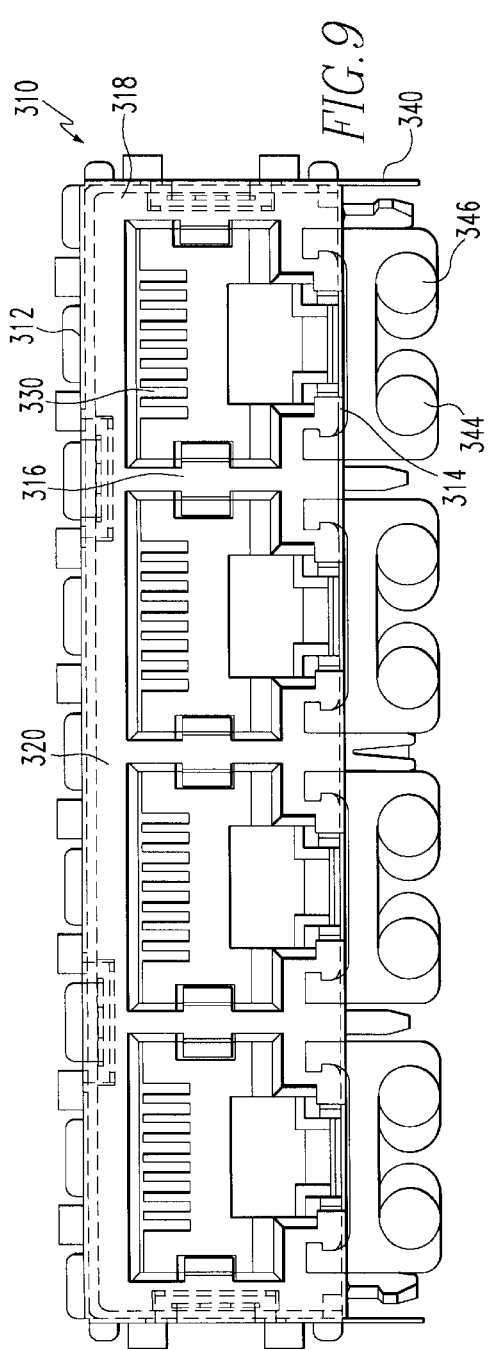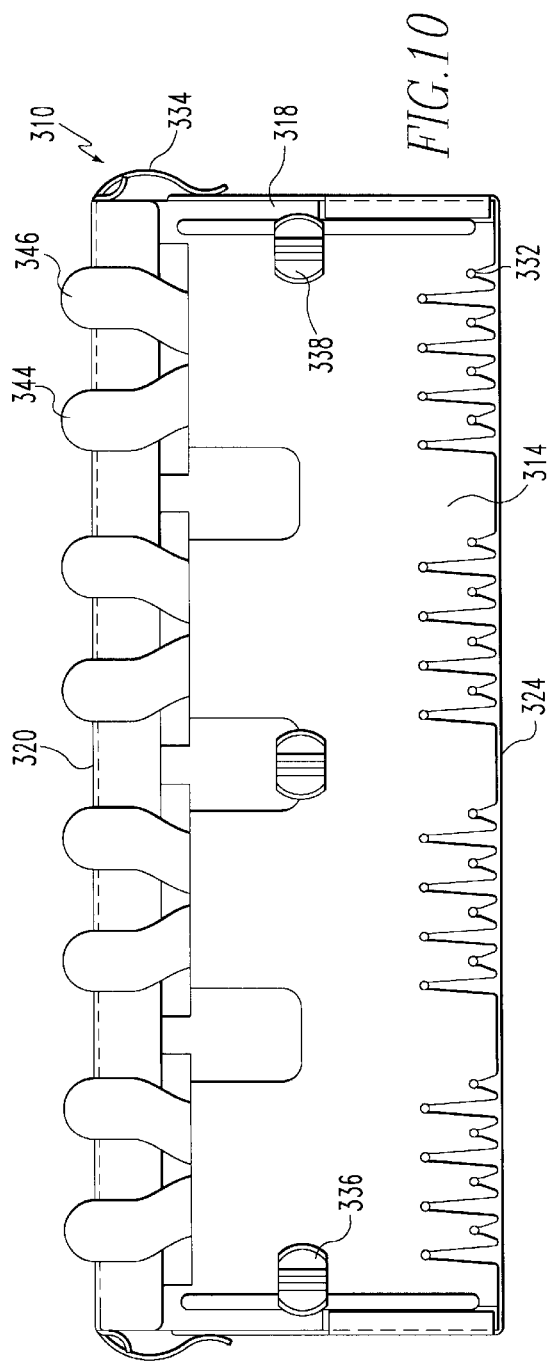

US 6,224,417 B1

ASSEMBLY CONTAINING A MODULAR JACK AND A LIGHT EMITTING DIODE

CROSS REFERENCE TO RELATED APPLICATION

This is a continuation-in-part of U.S. application Ser. No. 08/808,514, filed Feb. 27, 1997 (4477) and now U.S. Pat. No. 5,915,993.

BACKGROUND OF THE INVENTION

1. Field of the Invention

The present invention relates to electrical connectors and more particularly to electrical connectors including indicator means for showing the status of the connector.

2. Brief Description of Prior Developments

The prior art discloses various ways in which the status of electrical connectors may be indicated. A light emitting diode (LED) may be employed on the connector to show that it is engaged with its mating part, that a signal is being provided to the connector or that the connector is available for use. One disadvantage to using an LED on the connector is that the use of the LED may result in an undesirable amount of noise which may interfere with signals provided to the connector.

A need, therefore, exists for a modular jack which may make use of an LED without receiving an undesirable amount of noise from that LED.

SUMMARY OF THE INVENTION

The present invention is an assembly which includes a printed circuit board (PCB) having opposed first and second planar surfaces. At least one light emitting means such as an LED fixed to said PCB. A jack is fixed to one of said planar surfaces of the PCB. This jack comprises an insulative housing comprising first and second longitudinal walls positioned such that said second longitudinal wall is positioned over said first longitudinal wall in spaced parallel relation and at least one pair of lateral walls is interposed between the first and second longitudinal walls to form at least one traverse plug receiving cavity extending from a substantially open front side of said jack to a rear side of said jack. A light conducting means which is preferably a light is positioned adjacent the front side of the jack.

The present invention also encompasses an assembly which includes a jack having an insulative housing with first and second longitudinal walls positioned such that said second longitudinal wall is positioned over said first longitudinal wall in spaced parallel relation. At least one lateral wall is interposed between said first and second longitudinal wall. The jack is positioned such that the PCB is interposed between said first and second longitudinal wall. The first planar surface of the PCB faces the first longitudinal wall to form a first section of the jack, and the second planar surface of the PCB faces the second longitudinal wall to form a second section of the jack. Conductive terminals extend from the jack in said second section. An LED is located in the first section of the jack so that it does not interfere with signals passing through the conductive terminals.

BRIEF DESCRIPTION OF THE DRAWINGS

The assembly and modular jack of the present invention are further described with reference to the accompanying drawings in which:

FIG. 9 is a front elevational view of a modular gang jack representing still another preferred embodiment of the present invention;

FIG. 10 is bottom plan view of the modular gang jack shown in FIG. 9;

BRIEF DESCRIPTION OF THE PREFERRED EMBODIMENTS

Figure 1:
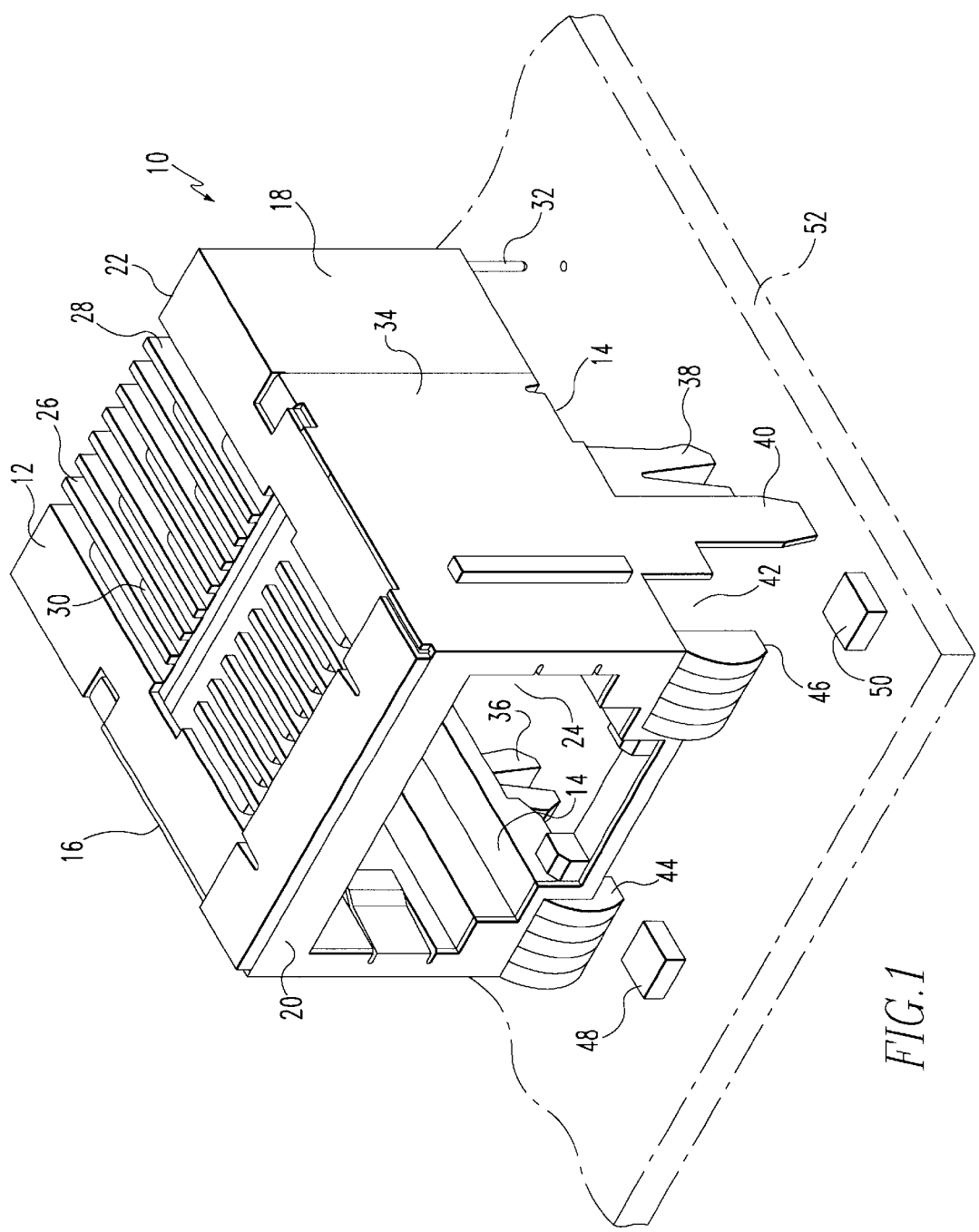
FIG. 1 is an exploded perspective view of an assembly comprised of a modular jack, PCB and LED which represents a preferred embodiment of the present invention.
Figure 2:
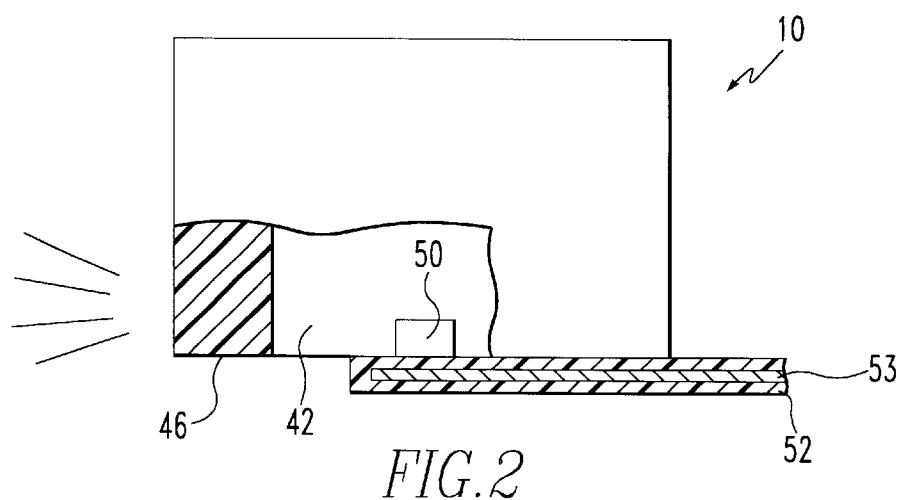
FIG. 2 is a schematic side view of the assembly shown in FIG. 1.

Referring to FIGS. 1–2, a modular jack is shown generally at numeral 10. This modular jack has an insulative housing which includes a top wall 12, a bottom wall 14, lateral walls 16 and 18, a front side 20 and a rear side 22. From the open front side 20 there is an insert receiving cavity 24 where the jack may be engaged by an insert as is shown, for example, in U.S. Pat. No. 5,456,619, the contents of which are incorporated by reference. On the top wall there are a number of conductor receiving grooves as at groove 26 and 28 which receive conductors such as wires 30 and 32. These wires extend upwardly parallel to the rear side then extend horizontally in the grooves in the top wall and from the front of the top wall extend downwardly and rearwardly into the cavity 24. The modular jack also includes a metallic shield 34 and mounting pins as at pins 36 and 38. There is also an additional downwardly extending mounting metallic projection 40 on shield 34 and an adjacent cavity 42 in the lateral wall 18. Another similar cavity (not shown) is in the lateral wall 16. At the front of these cavities there are, respectively, lenses 44 and 46 which are fixed to the housing by adhesive, heat welding or any other suitable means well known to those skilled in the art. LED 48 and LED 50 are mounted on PCB 52. The PCB also includes a conventional metallized medial shield plane 53. As is shown particularly in FIG. 2, LED 50 fits in cavity 42. Light from LED 50 is refracted by lens 46 so that the user is apprised of some status of the jack. Similarly, light from LED 48 is refracted through lens 44. Appropriate circuitry is provided on the PCB to cause LED's 48 and/or 50 to emit light under certain status conditions.

Figure 5:
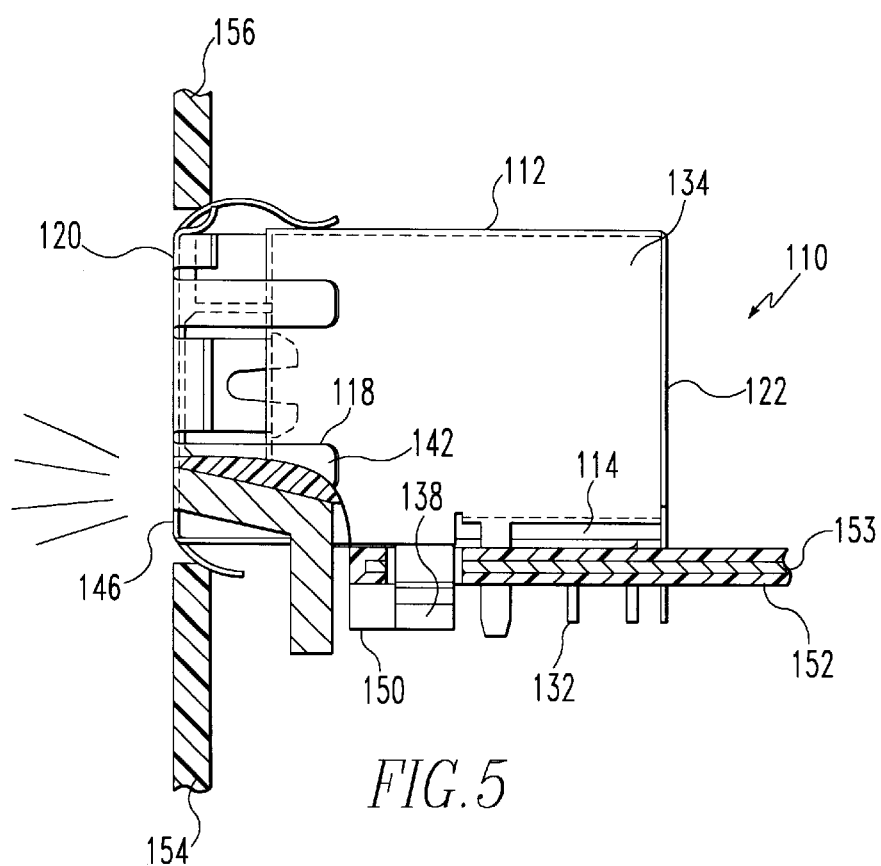
FIG. 5 is a end view of an assembly including the modular gang jack shown in FIG. 3 along with the PCB and LED.
Figure 3:
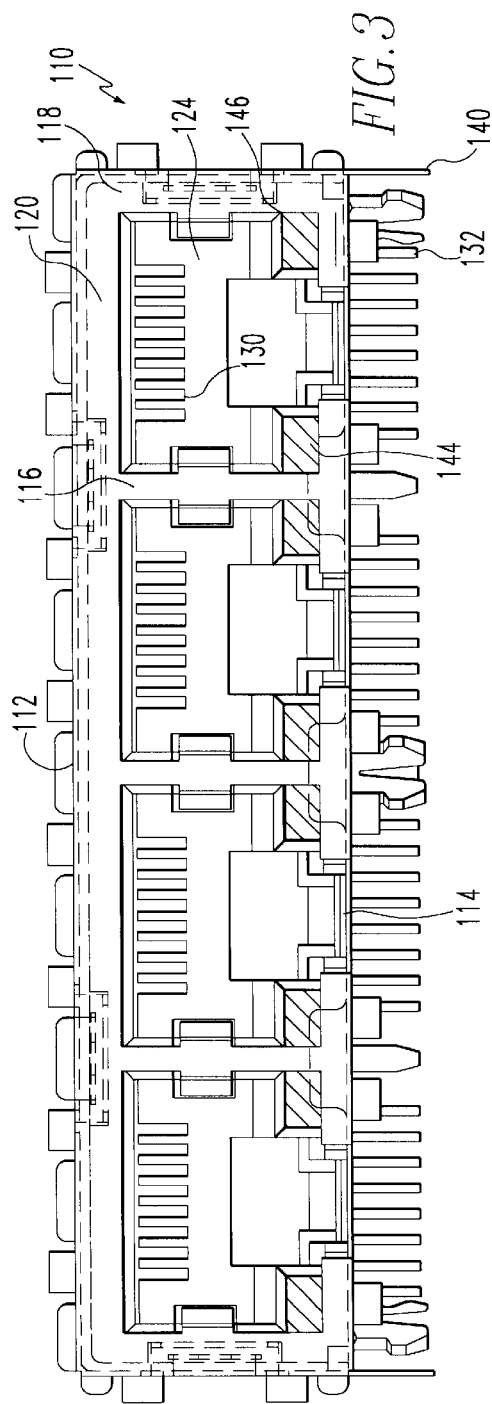
FIG. 3 is a front elevational view of a modular jack representing another preferred embodiment of the present invention.
Figure 4:
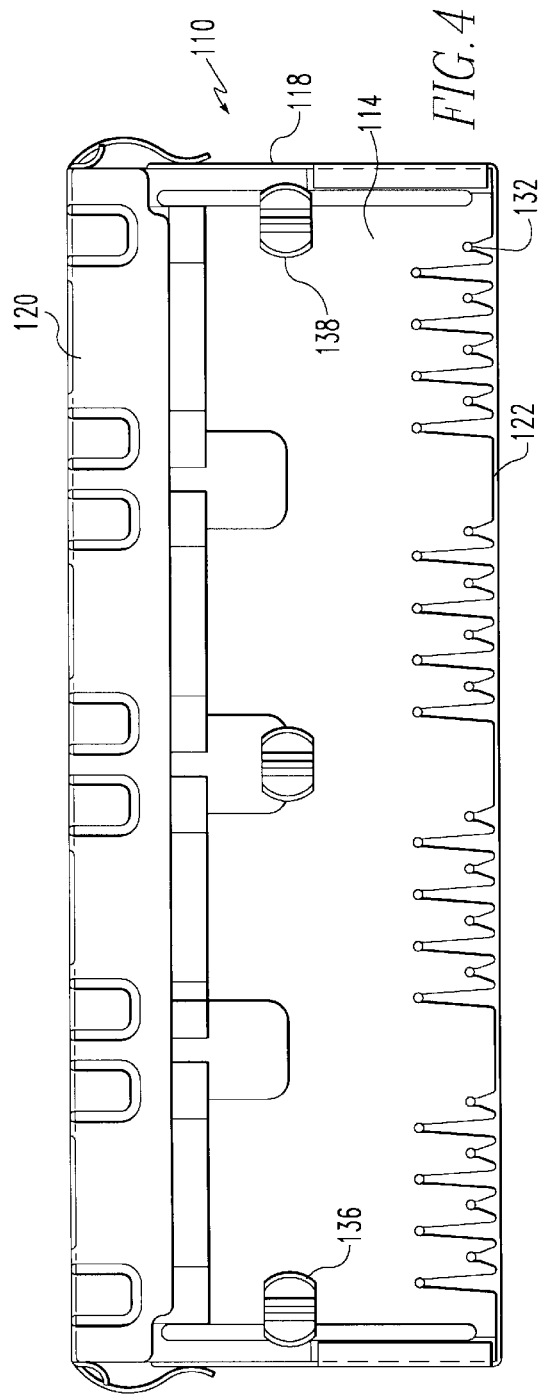
FIG. 4 is a bottom plan view of the modular jack shown in FIG. 3.

Referring to FIGS. 3–5, another preferred embodiment is represented by a modular gang jack which is shown generally at numeral 110. This modular jack has an insulative housing which includes a top all 112, a bottom wall 114, lateral walls 116 and 118, a front side 120 and a rear side 122. From the open front side 120 there are a number of insert receiving cavities as at insert receiving cavity 124 where the jack may be engaged by an insert. The modular jack also includes a metallic shield 134 and mounting pins as at pins 136 and 138. Under a shield on the top wall there are a number of conductor receiving grooves (not shown) which receive conductors such as wires 130 and 132. These wires extend upwardly parallel to the rear side then extend horizontally in the grooves in the top wall and from the front of the top wall extend downwardly and rearwardly into the cavity 124. There is also an additional downwardly extending mounting projection 140 from the shield and an adjacent cavity 142 in the lateral wall 118. Another similar cavity (not shown) is in the lateral wall 116 and in each of the other lateral walls. At the front of these cavities there are, respectively, lenses 144 and 146. LED 150 is mounted on the bottom surface of PCB 152. The PCB includes a metallized medial shield plane 153. As is shown particularly in FIG. 5, LED 150 fits in cavity 152. Light from LED 150 is refracted by lens 146 so that the user is informed of some status of the jack. It will also be seen that the jack is interposed between two panel sections 154 and 156.

Figure 6:
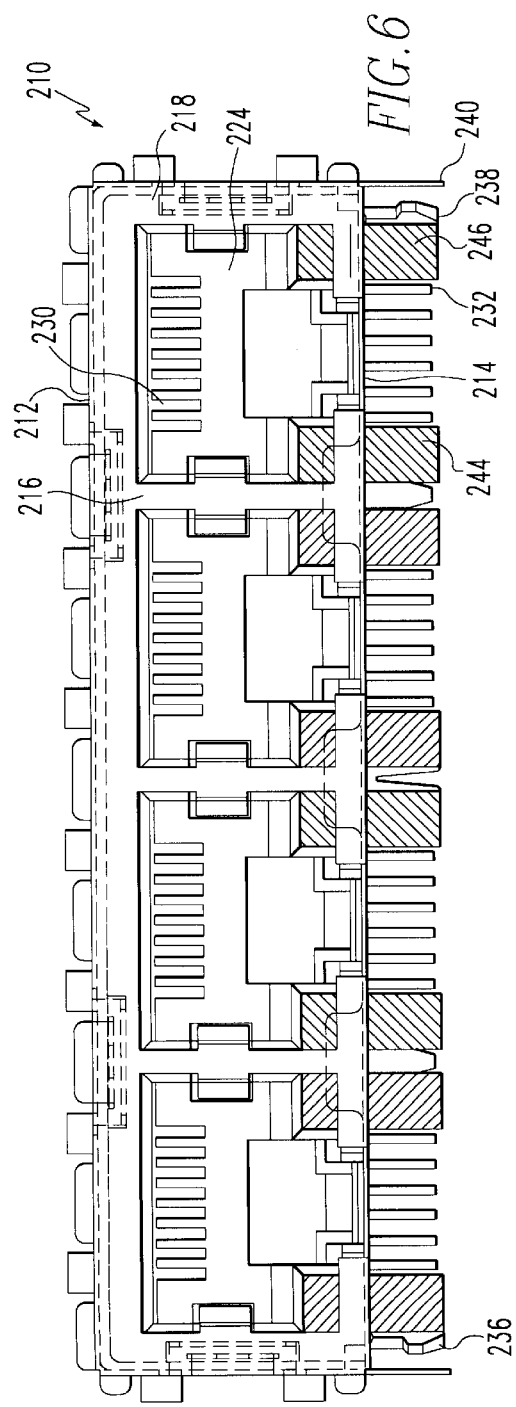
FIG. 6 is a front elevational view of a modular gang jack representing another preferred embodiment of the present invention.
Figure 7:
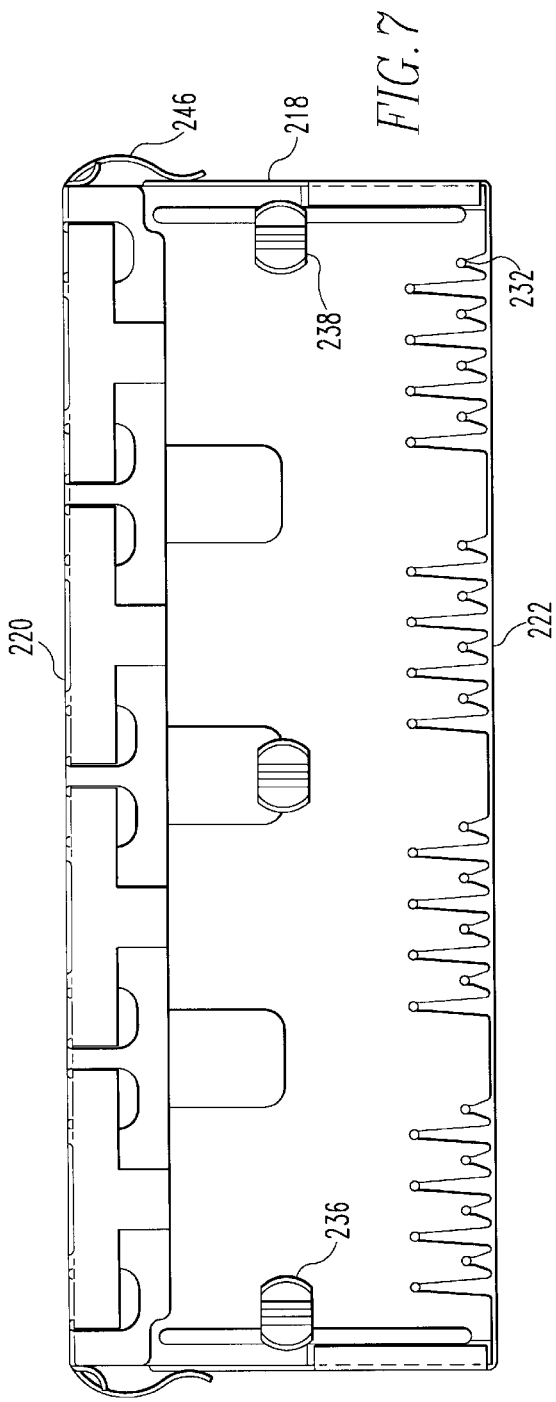
FIG. 7 is a bottom plan view of the modular gang shown in FIG. 6.
Figure 8:
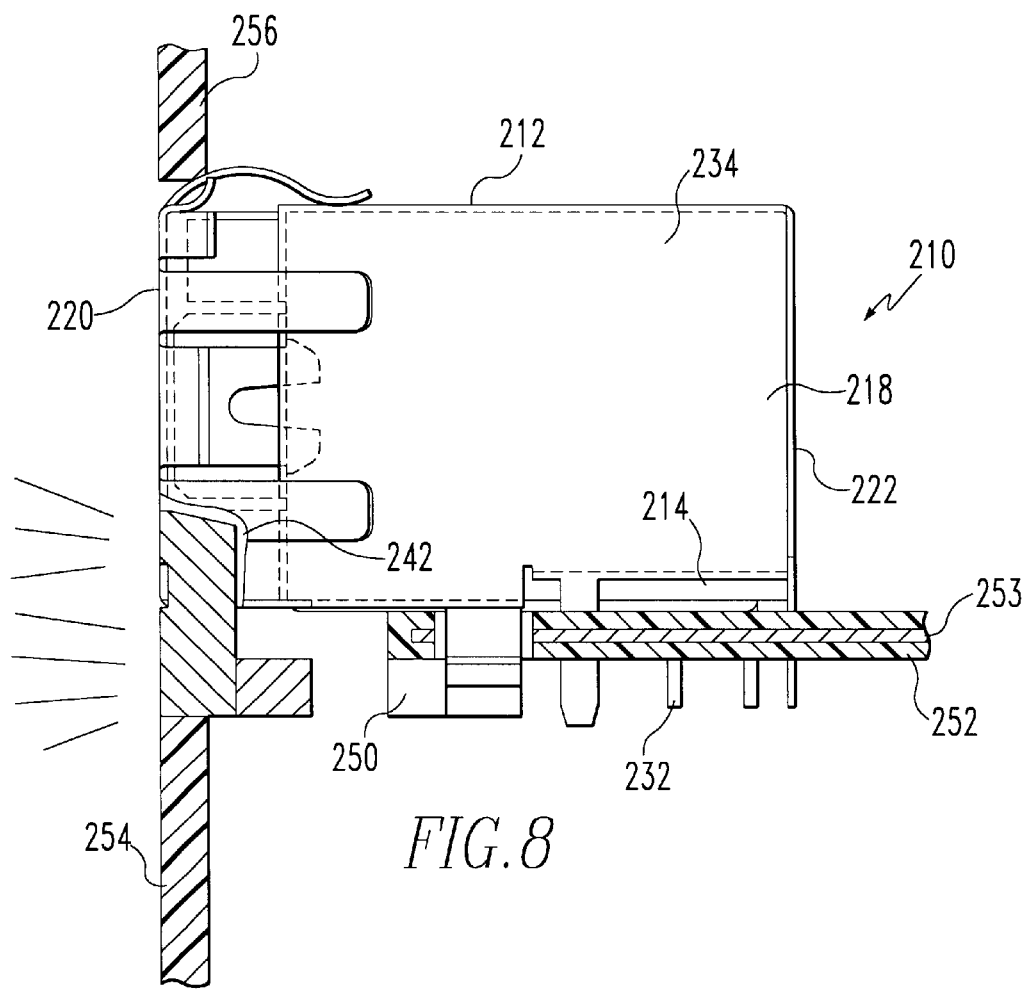
FIG. 8 is a modular jack representing still another alternative preferred embodiment of the present invention.

Referring to FIGS. 6–8, another preferred embodiment is repressed by a modular jack which is shown generally at numeral 210. This modular jack has an insulative housing which includes a top wall 212, a bottom wall 214, lateral walls 216 and 218, a front side 220 and a rear side 222. From the open front side 220 there are a plurality of insert receiving cavity such as insert receiving cavity 224 where the jack may be engaged by an insert. Under the shield on the top wall there are a number of conductor receiving grooves (not shown) which receive conductors such as wires 230 and 232. These wires extend upwardly parallel to the rear side then extend horizontally in the grooves in the top wall and from the front of the top wall extend downwardly and rearwardly into the cavity 224. The modular jack also includes a metallic shield 234 and mounting pins as at pins 226 and 228. There is also an additional downwardly extending shield mounting projection 240 and an adjacent cavity 242 in the lateral wall 218. Another similar cavity (not shown) is in the lateral wall 216 and in each of the other lateral walls. At the front of these cavities there are, respectively, lenses 244 and 246 which are fixed to the housing. LED 248 is mounted on the bottom surface of PCB 252. As is shown particularly in FIG. 8, LED 250 fits in cavity 252. The PCB also includes a conventional metallized medial shield plane 253. Light from LED 250 is refracted or conducted by lens 246 so that the user is apprised of some status of the jack. It will also be seen that section lens 246 is superimposed on a panel 254 and above the jack there is another panel section 256.

Figure 11:
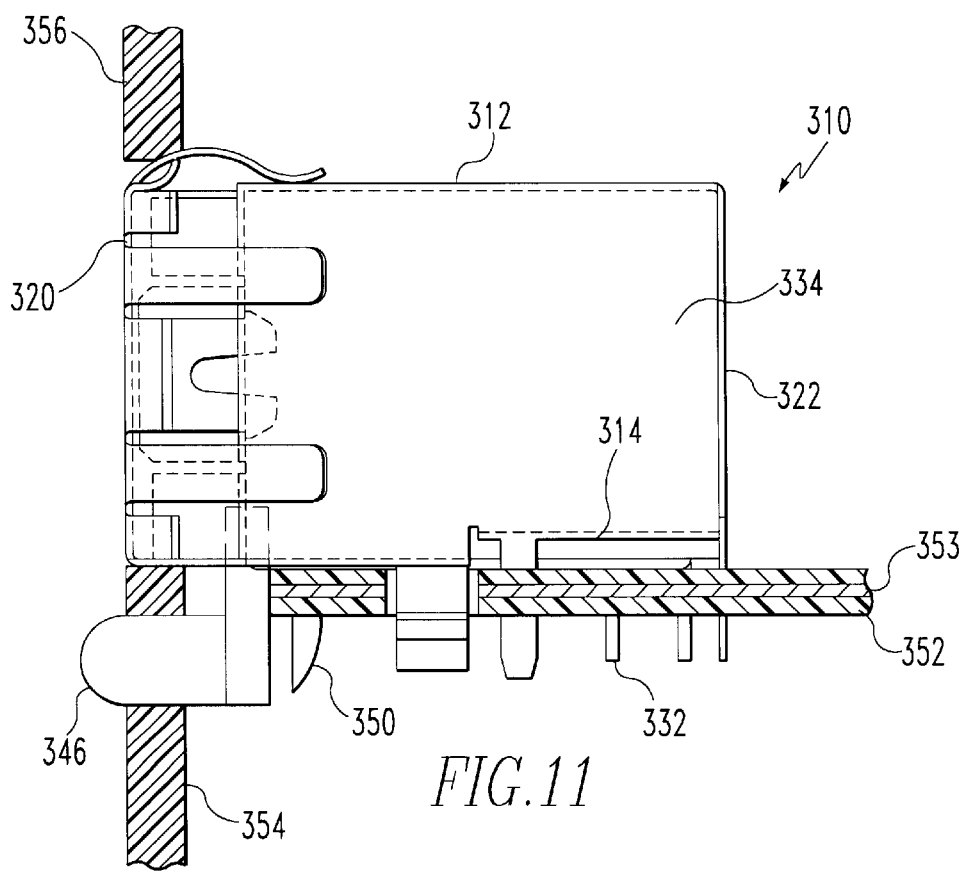
FIG. 11 is a end view of an assembly made up the modular gang jack shown in FIG. 9, a PCB and an LED.

Referring to FIGS. 9–11, a modular jack representing another preferred embodiment is shown generally at numeral 310. This modular jack has an insulative housing which includes a top wall 312, a bottom wall 314, lateral walls 316 and 318, a front side 320 and a rear side 322. From the open front side 320 there is an insert receiving cavity 324 where the jack may be engaged by an insert. Under a shield on the top wall there are a number of conductor receiving grooves (not shown) which receive conductors such as wires 230 and 232. These wires extend upwardly parallel to the rear side then extend horizontally in the grooves in the top wall and from the front of the top wall extend downwardly and rearwardly into the cavity 324. The modular jack also includes a metallic shield 334 and mounting pins as at pins 326 and 328. The panel section 354 and 356 are positioned below and above the jack, and the lenses as at lens 344 and 346 are mounted in apertures in the lower panel section 354. LED 350 is mounted on the bottom surface of PCB 352. As is shown particularly in FIG. 11, lens 346 is suspended from the PCB 352. Light from LED 350 is refracted or conducted by lens 346 so that the user is apprised of some status of the jack.

Figure 12:
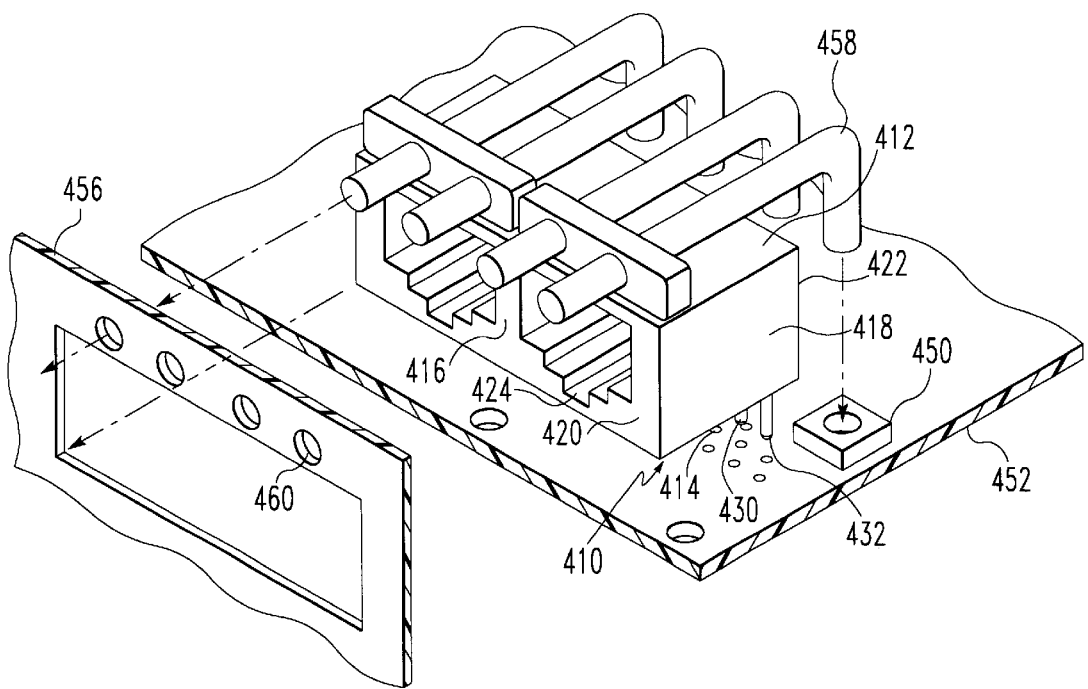
FIG. 12 is an exploded perspective view of an assembly representing still another preferred embodiment of the present invention.
Figure 13:
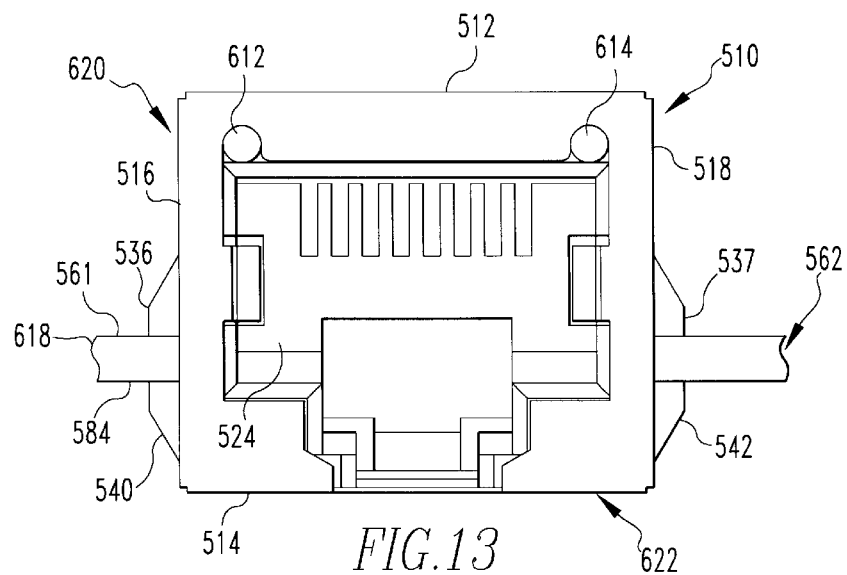
FIG. 13 is a front elevational view of an assembly of a modular jack with LEDS and a PCB representing still another preferred embodiment of the present invention.
Figure 14:
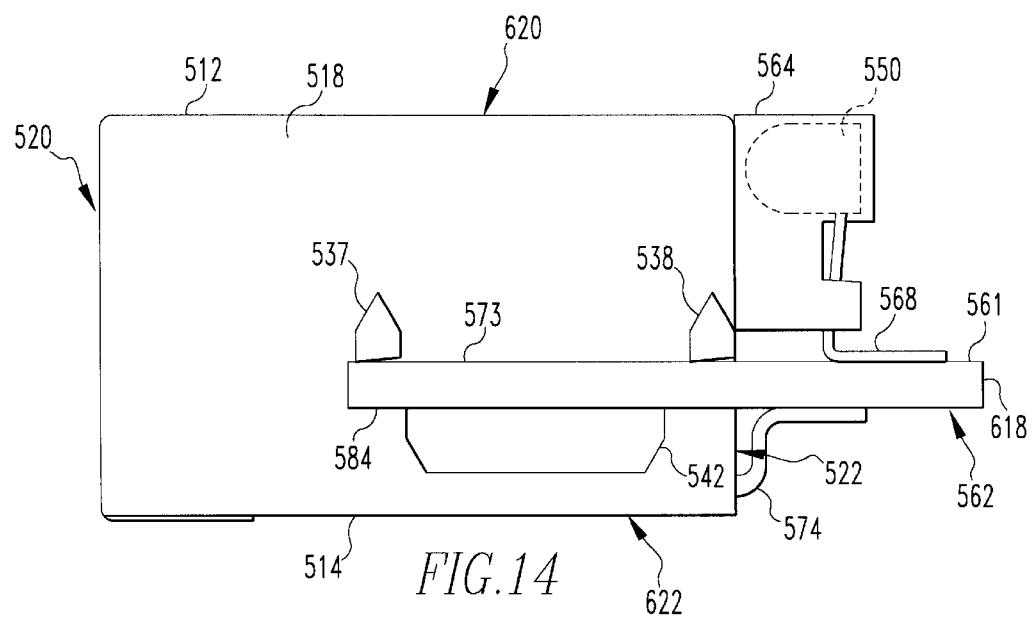
FIG. 14 is a side view of the assembly shown in FIG. 13.

Referring to FIG. 12, a modular jack is shown generally at numeral 410. This modular jack has an insulative housing which includes a top wall 412, a bottom wall 414, lateral walls 416 and 418, a front side 420 and a rear side 422. From the open front side 420 there is an insert receiving cavity 424 where the jack may be engaged. On the top wall beneath a shield 434 there are a number of conductor receiving grooves (not shown) which receive conductors such as wires 430 and 432. These wires extend upwardly parallel to the rear side then extend horizontally in the grooves in the top wall and from the front of the top wall extend downwardly and rearwardly into the cavity 424. LED's such as LED 450 are mounted on PCB 452. The PCB also includes a conventional metallized medial shield plane (not shown) The LED's are engaged by light pipes as at light pipes 458 which extends upwardly then horizontally to engage apertures as at aperture 460 in panel 436.

Figure 15:
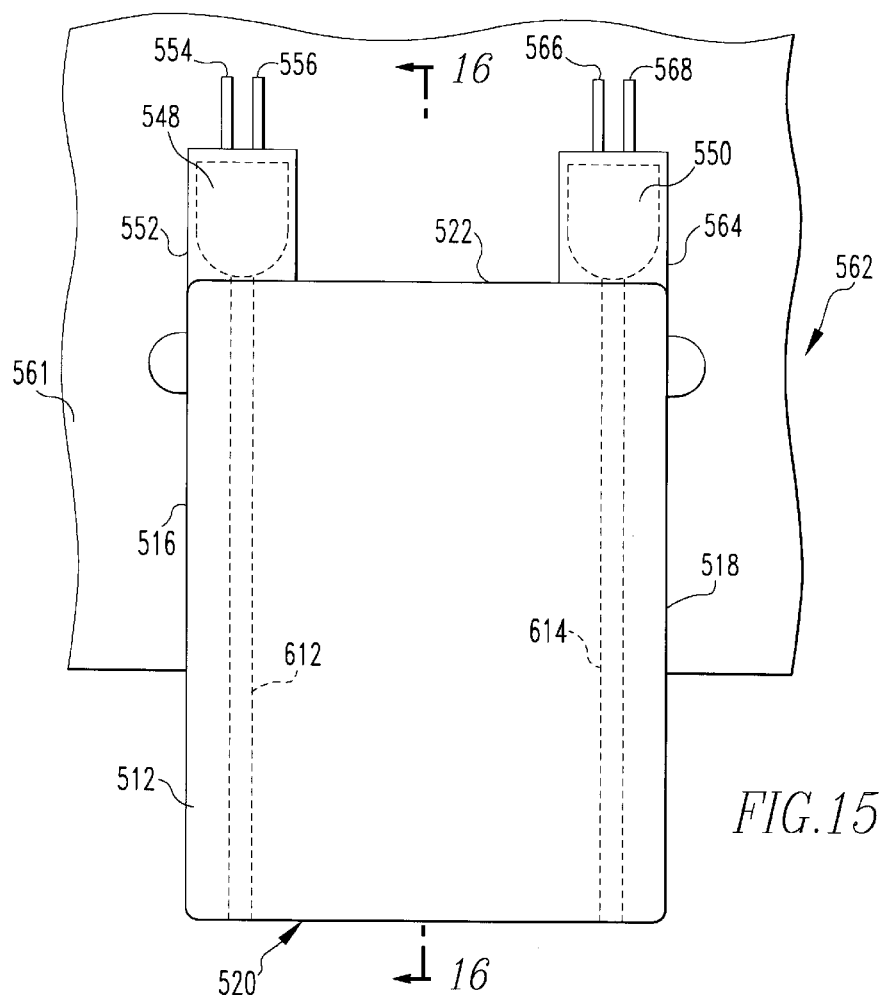
FIG. 15 is a top plan view of the assembly shown in FIG. 13.
Figure 16:
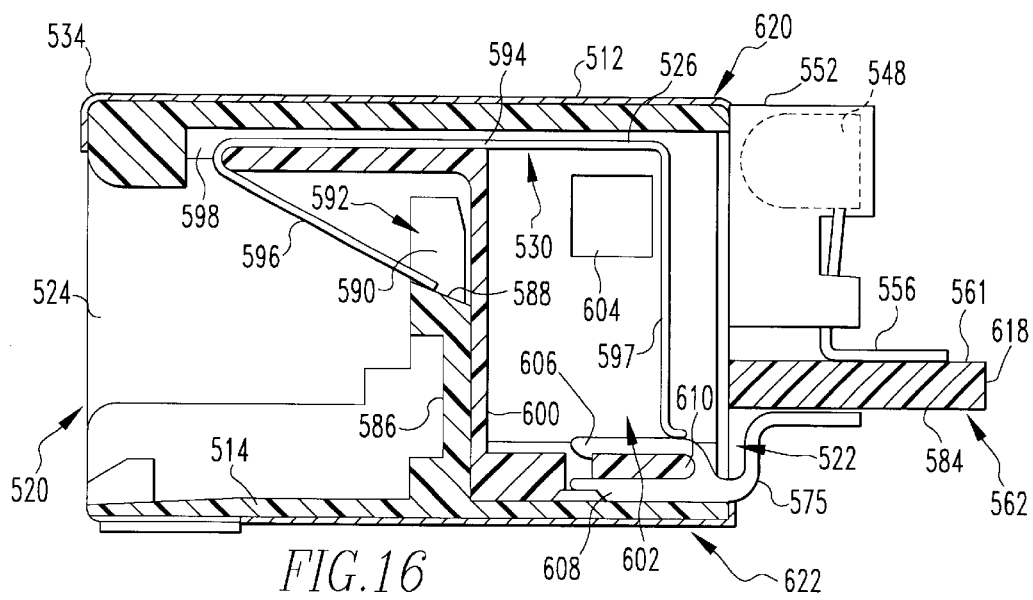
FIG. 16 is a cross sectional view through 16—16 in FIG. 15.

Referring to FIGS. 13–18, another embodiment of a modular jack of the present invention is shown generally at numeral 510. This modular jack has an insulative housing which includes a top wall 512, a bottom wall 514, lateral walls 516 and 518, a front side 520 and a rear side 522. From the open front side there is an insert receiving cavity 524 where the jack may be engaged by an insert in the same way described with the proceeding embodiments. On the top wall there are a number of conductor receiving grooves as at groove 526 (FIG. 16) which receive wires as at wire (FIG. 16). The modular jack also includes a metallic shield 534. Projecting from this metallic shield there are upper metallic mounting projections 536, 537 and 538 as well as another such projection (not shown). Also projecting from the metallic shield 534 are lower metallic mounting projections 540 and 542. These metallic mounting projections serve to retain the modular jack 510 in position until soldering takes place as will be described hereafter. Adjacent the rear side of the modular jack 510 there is a light emitting diode (LED) 548 and on the opposed edge of the rear side there is a second LED 550. The LED 548 has a plastic casing 552 and conductive terminals 554. These terminals 554 and 556 contact, respectively, conductive traces 558 and 560 (FIG. 17) on the top surface 561 of PCB 562. The LED 550 also has a plastic casing and conductive terminals. These conductive terminals 566 and 568 contact conductive traces 570 and 572 (FIG. 17) on the top surface 561 of PCB 562. The LED 550 has a plastic casing 564 and terminals 566 and 568 which contact conductive traces 570 and 572 on the top surface 561 of PCB 562. The modular jack 510 has terminals 574 and 575 and six other terminals (not shown) extending upwardly than rearwardly from adjacent the bottom wall at the rear side 522 to contact conductive traces 576–583 on the bottom side 584 of the PCB 562.

Referring particularly to FIG. 16, it will be seen that the modular jack 510 has a front medial wall 586 with a sloped upper surface 588. The medial wall 586 has a plurality of vertical wall extensions as at extension 590 that form a plurality of vertical grooves as at groove 592. The wires as at wire 593 have horizontal legs as at leg 594, oblique legs as at leg 596 and vertical legs as at 597 to convert to terminals as at terminal 575. There is a slot 598 in the top wall 594 and which allow the oblique section 596 of the wire 530 to extend downwardly and rearwardly into the insert receiving cavity 524 and to come to rest in the groove 592 on the sloped upper surface 588 of the front medial wall 586. There is also a rear medial wall 600 extending completely between the top wall 512 and bottom wall 514 to form a rear component housing cavity 602 which holds one or more electronic components shown schematically at component 604. Such components may be, for example, magnetics, common mode chokes, resistor, capacitors or transformers. The terminals of the modular jack 510 as at terminal 570 have an upper fork 606 and a lower fork 608 which engage a terminal retaining feature 610 adjacent the bottom wall 514 of the modular jack.

Referring particularly to FIG. 15, a light pipes, 612 and 614, respectively, extend from LED 548 and LED 550 adjacent the rear side 552 through the top wall 512 to the front side 520 to be visible on that front side. As is known in the art, the visibility of the light pipe may be enhanced by means of a conical or pyramidal feature (not shown) on the front side 520 of the modular jack 510.

Figure 17:
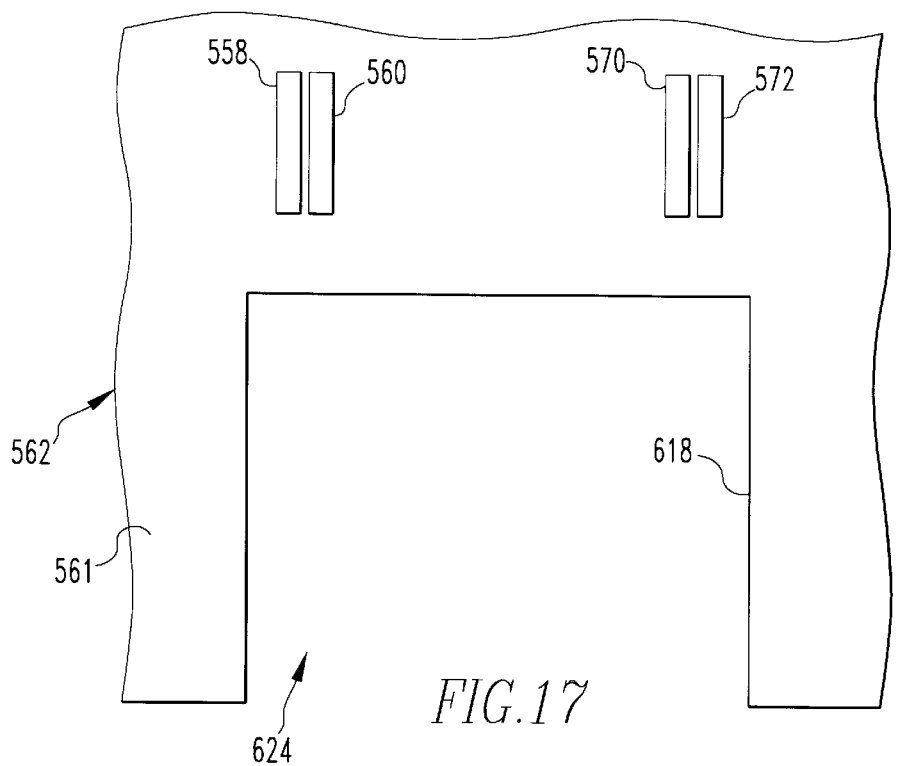
FIG. 17 is a top plan view of the PCB shown in FIG. 13.
Figure 18:
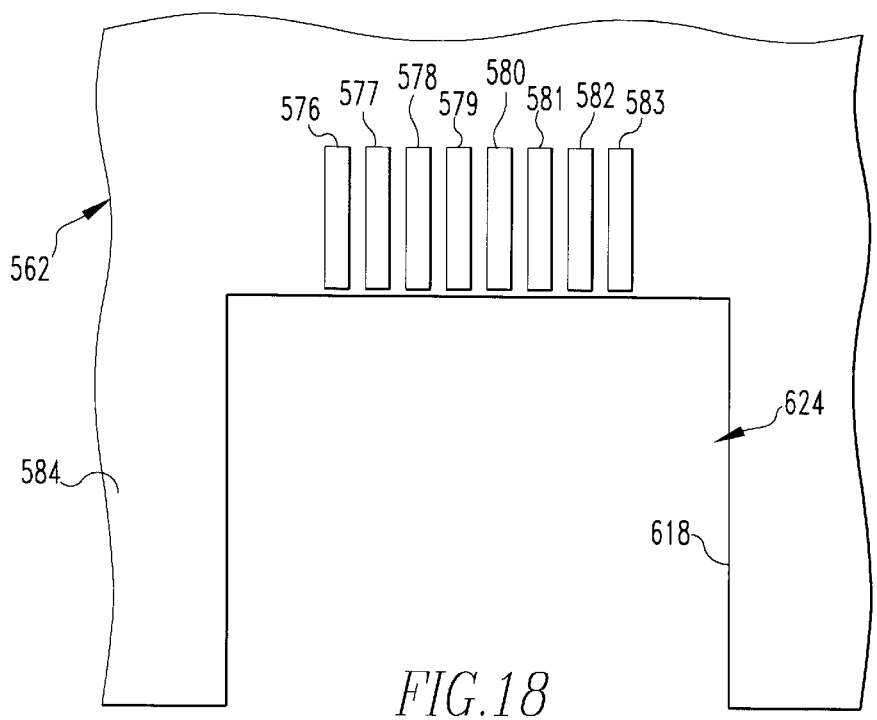
FIG. 18 is a bottom plan view of the PCB shown in FIG. 17.

Referring again to the figures generally and for the purpose of further describing the position of the jack relative to the PCB, it will be seen that between the top surface 561 and bottom surface 584 of the PCB 562 there is a vertical edge 618. This edge 618 is interposed between the top wall 512 and bottom wall 514 of the jack. It will also be seen that the top surface 561 of the PCB 562 faces a top section 620 of the jack, and the bottom surface 584 of the PCB 562 faces a bottom section 622 of the PCB 562. Referring particularly to FIGS. 15, 17 and 18, the PCB 562 has a recess 624 for receiving the jack. At the edge 618 of the PCB 562 in this recess the PCB abuts or nearly abuts the lateral walls 516 and 518 of the modular jack 510.

It will be appreciated that a modular jack has been described which makes use of an LED which, because it is mounted on the PCB rather than being integral with the jack itself, signals provided to the LED will be relatively remote from those provided to the connector so that there will be relatively little interference with the connector signals.

It will also be appreciated that a modular jack has been described which makes use of an LED, and which is mounted relative to a PCB so that the LED is connected to one side of the PCB, and the terminals from the modular jack are connected to the other side of the PCB. Because of this particular arrangement, there will again be relatively little interference from the LED with the connector signals.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An assembly comprising:
   (a) a printed circuit board (PCB) having opposed first and second planar surfaces;
   (b) a jack comprising an insulative housing comprising first and second longitudinal walls positioned such that said second longitudinal wall is positioned adjacent said first longitudinal wall in spaced parallel relation and at least one lateral wall is interposed between said first and second longitudinal walls and said jack is positioned such that the PCB is interposed between said first and second longitudinal walls and the first planar surface of the PCB faces the first longitudinal wall to form a first section of the jack and the second planar surface of the PCB faces the second longitudinal wall to form a second section of the jack and conductive terminals extend from the jack in said second section and connected to the second planar surface of the PCB; and
   (c) a light emitter located on the first section of the jack and connected to the first planar surface of the PCB.

2. The assembly of claim 1 further comprising a pair of lateral walls interposed between the first and second longitudinal walls to form at least one plug receiving cavity at the front side of the jack.

3. The assembly of claim 2 further comprising a light conductor extending from the light emitter to a position adjacent the front side of the jack.

4. The assembly of claim 3 further comprising a rear side of the jack in opposed relation to the front side of the jack and the light emitter is adjacent said rear side of the jack.

5. The assembly of claim 4 wherein the terminals extend away from the light emitter.

6. The assembly of claim 1 wherein the PCB has an edge extending between the first and second planar surfaces of the PCB and said edge is interposed between the first and second longitudinal walls of the jack.

7. The assembly of claim 6 wherein the PCB has a recess and the jack is received in the recess in the PCB.

8. The assembly of claim 7 wherein the lateral wall abuts the edge of the PCB.

9. The assembly of claim 3 wherein the light conductor is a light pipe.

10. The assembly of claim 1 wherein the light emitter is a light emitting diode (LED).

11. The assembly of claim 1 wherein the first longitudinal wall is a top wall and the second longitudinal wall is a bottom wall.

12. The assembly of claim 1 wherein the first planar surface of the PCB is a top surface and the second planar surface of the PCB is a bottom surface.

13. An assembly comprising:
   (a) a printed circuit board (PCB) having opposed bottom and top planar surfaces and an edge extending between the bottom and top planar surfaces;
   (b) a jack comprising an insulative housing having conductive terminals and comprising bottom and top walls that extend from a front side of said jack to a rear side of said jack and a pair of lateral walls interposed between the bottom and top walls and extending from said front side to said rear side of said jack and said jack is positioned such that the edge of the PCB is vertically interposed between the bottom and top walls of the jack and the conductive terminals extend from the jack to be connected to the bottom planar surface of the PCB; and
   (c) a light emitter located on the jack above the top planar surface of the PCB.

14. The assembly of claim 13 wherein the light emitter is a light emitting diode (LED).

15. An assembly comprising:
   (a) a printed circuit board (PCB) having opposed bottom and top planar surfaces and an edge extending between the bottom and top planar surfaces.
   (b) a jack comprising an insulative housing having conductive terminals and comprising bottom and top walls that extend from a front side of said jack to a rear side of said jack and a pair of lateral walls interposed between the bottom and top walls and extending from said front side to said rear side of said jack and said jack is positioned such that the edge of the PCB is vertically interposed between the bottom and top walls of the jack and the conductive terminals extend from the jack to be connected to the bottom planar surface of PCB;
   (c) a light emitter located on the jack adjacent the rear side of the jack and above the top planar surface of the PCB; and
   (d) a light conveyor connecting the light emitting means to the front side of the jack.

16. The assembly of claim 15 wherein the light emitter is a light emitting diode (LED).

17. The assembly of claim 16 wherein the light conveyor is a light pipe.

18. An electrical connector for edge mounting to a circuit substrate having a first side, an opposite second side and an edge extending between said first side and said second side, the connector comprising:
   a housing adapted to straddle the edge of the circuit substrate and having:
      a top located to the first side of the circuit substrate;
      a bottom located to the second side of the circuit substrate; and
      an opening to receive a mating connector;
   terminals extending through said housing to engage the mating connector and to mount to the second side of the circuit substrate; and
   a light emitter mountable to the first side of the circuit substrate.

19. The electrical connector as recited in claim 18, in combination with the circuit substrate to which said connector mounts, said circuit substrate having a recess along said edge to receive said housing.

20. The electrical connector as recited in claim 18, further comprising an insert mountable in said opening, said terminals residing in said insert.

21. The electrical connector as recited in claim 18, further comprising a light conveyor extending through said housing and positionable adjacent said light emitter.

22. The electrical connector as recited in claim 18, wherein said light emitter and said terminals have surface mount tails for surface mounting to the circuit substrate.

* * * * *